United States Patent
Ren et al.

(10) Patent No.: US 9,897,649 B2
(45) Date of Patent: Feb. 20, 2018

(54) METHOD FOR TESTING COMPARATOR AND DEVICE THEREFOR

(71) Applicant: FREESCALE SEMICONDUCTOR, INC., Austin, TX (US)

(72) Inventors: Juxiang Ren, Austin, TX (US); Chris C. Dao, Pflugerville, TX (US); Stefano Pietri, Austin, TX (US)

(73) Assignee: NXP USA, INC., Austin, TX (US)

(\*) Notice: Subject to any disclaimer, the term of this patent is extended or adjusted under 35 U.S.C. 154(b) by 268 days.

(21) Appl. No.: 14/853,090

(22) Filed: Sep. 14, 2015

(65) Prior Publication Data

US 2016/0003908 A1 Jan. 7, 2016

Related U.S. Application Data

(62) Division of application No. 13/414,697, filed on Mar. 7, 2012, now Pat. No. 9,134,395.

(51) Int. Cl.
| | |
|---|---|
| *G01R 33/02* | (2006.01) |
| *H03K 5/153* | (2006.01) |
| *G01R 31/317* | (2006.01) |
| *G01R 35/00* | (2006.01) |
| *G01R 31/3163* | (2006.01) |
| *H03K 5/24* | (2006.01) |
| *G01R 31/3167* | (2006.01) |

(52) U.S. Cl.
CPC ... *G01R 31/31703* (2013.01); *G01R 31/3163* (2013.01); *G01R 35/00* (2013.01); *H03K 5/24* (2013.01); *G01R 31/3167* (2013.01)

(58) Field of Classification Search
CPC .......... G01R 31/31703; G01R 31/3163; G01R 35/00; G01R 31/3167; H03K 5/24
USPC ................................ 324/252, 750.03; 327/73
See application file for complete search history.

(56) References Cited

U.S. PATENT DOCUMENTS

| | | | |
|---|---|---|---|
| 4,965,800 A | 10/1990 | Farnbach | |
| 6,111,965 A | 8/2000 | Lubbe et al. | |
| 7,924,044 B2 | 4/2011 | Ma | |
| 2006/0046957 A1 | 3/2006 | Carvalho | |
| 2009/0174392 A1 | 7/2009 | Kadner | |
| 2009/0278562 A1 | 11/2009 | Zaitsu | |
| 2010/0231252 A1\* | 9/2010 | Goel ................. | G01R 31/31715 324/750.3 |
| 2010/0315887 A1 | 12/2010 | Park | |
| 2011/0137604 A1 | 6/2011 | Dasnurkar | |
| 2012/0001639 A1 | 1/2012 | Mizoguchi et al. | |
| 2012/0319735 A1 | 12/2012 | Nagda et al. | |

\* cited by examiner

*Primary Examiner* — Farhana Hoque

(57) ABSTRACT

An integrated circuit facilitates a self test routine that verifies proper operation of an analog comparator. In response to entering the self test routine, the voltage provided to an input of a comparator is changed from being at an operating voltage supply to being at a self test voltage that is used to verify operation of the comparator. In response to the comparator operating properly, the self test voltage provided to the input of the comparator is replaced with the operating voltage supply, and normal operation resumes. The duration of the self test cycle is based upon the amount of time during which the self test voltage is provided to the comparator is asynchronous in nature, and therefore not a function of a clock signal.

6 Claims, 6 Drawing Sheets

METHOD FOR TESTING COMPARATOR AND DEVICE THEREFOR

CROSS-REFERENCE TO RELATED APPLICATION(S)

The present application is a divisional of U.S. patent application Ser. No. 13/414,697, entitled "METHOD FOR TESTING COMPARATOR AND DEVICE THEREFOR" filed on Mar. 7, 2012, the entirety of which is herein incorporated by reference.

BACKGROUND

Field of the Disclosure

The present disclosure relates generally to electronic devices, and more particularly to the testing of electronic devices.

Description of the Related Art

In various applications it can be desirable to have the ability for an integrated circuit device to perform a self test to determine if a certain aspect of the integrated circuit is not operating properly. However, self test operation often prevent an intended function from being performed.

BRIEF DESCRIPTION OF THE DRAWINGS

The present disclosure may be better understood, and its numerous features and advantages made apparent to those skilled in the art by referencing the accompanying drawings.

DETAILED DESCRIPTION

An integrated circuit facilitates a self test routine that verifies proper operation of an analog comparator. During self test, the voltage provided to an input of a comparator is changed from an operating voltage supply of the integrated circuit that is being monitored by the comparator to a trip voltage during normal operation to a self test voltage that is compared to the trip voltage in order to verify proper operation of the comparator. In response to the comparator operating properly, the self test voltage provided to the input of the comparator is replaced with the operating voltage supply of the integrated circuit, and normal operation resumes. The duration of the self test cycle is asynchronous in nature in that the duration is based upon the response time of the comparator, and not upon a clock signal.

Figure 1:
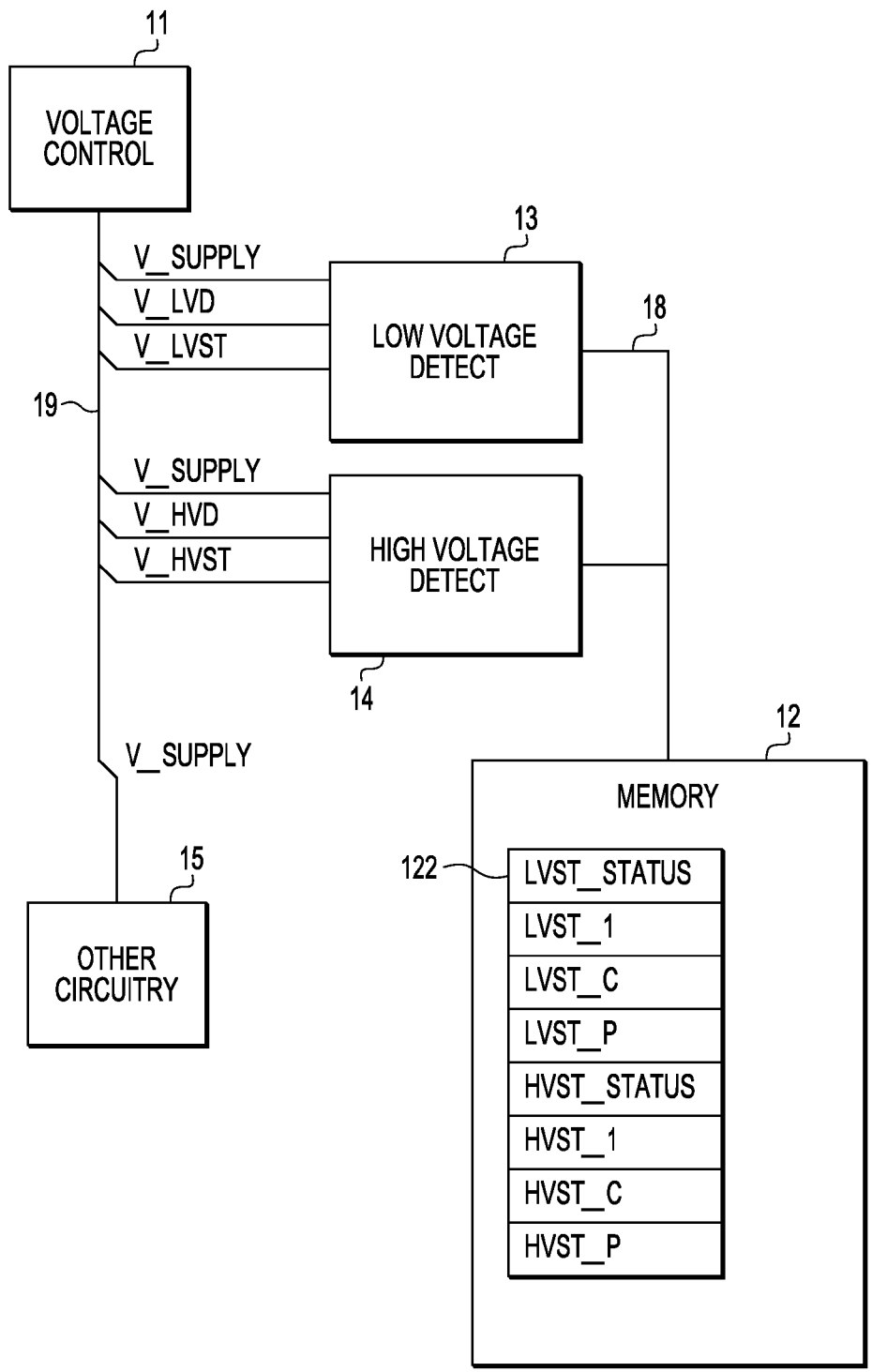
FIG. 1 illustrates a block diagram of a portion of a system in accordance with a specific embodiment to the present embodiment of the disclosure.

FIG. 1 illustrates a portion of an electronic device 10 in accordance with a specific embodiment of the present disclosure. Electronic device 10 can be a portion of an integrated circuit, such as an integrated circuit formed at a common semiconductor substrate. The device 10 can be implemented in an electronic system, which can also be referred to as a device, such as a portable or non-portable system. Examples of portable and non-portable systems can include consumer goods, such as consumer electronics, and durable consumer goods. In one embodiment the device 10 can be implemented in an automobile, a printed circuit board including an integrated circuit, a handheld computing device, a personal computer, a computer server, or components within any of these types of systems.

Device 10 includes a voltage control module 11, a memory 12 that includes programmable storage locations 122, a low-voltage detect module 13, and a high-voltage detect module 14. Voltage control module 11 provides one or more voltages including an operating supply voltage (V_SUPPLY), a low voltage detect voltage (V_LVD), a low voltage self test voltage (V_LVST), a high voltage detect voltage (V_HVD), and a high voltage self test voltage (V_HVST). These voltages can be internally generated, e.g., regulated, by the voltage control module 11, or can be provided from external supply. The voltage control module 11 is connected to one or more voltage reference nodes 19 that are connected to various circuitry of the integrated circuit device 10. In particular: V_SUPPLY is provided to other circuitry 15, to low voltage detect module 13, and to high voltage detect module 14; V_LVD and V_LVST are provided to low voltage detect module 13; V_HVD and V_HVST are provided to high voltage detect module 14.

The low-voltage detect module 13 and the high-voltage detect module 14 are connected to memory module 12 via an interconnect 18. It will be appreciated that memory module 12 can be implemented using various types of volatile and non-volatile memory, and can be general purpose or specialized memory. For example, in one embodiment the memory module 12 is a register file that includes registers (storage locations) labeled LVST_STATUS, LVST_1, LVST_C, LVST_P, HVST_STATUS, HVST_1, HVST_C, and HVST_P. Note that for purposes of convenience, the same reference name is used to refer to a particular storage location and to the value stored thereat. For example, the information stored at register LVST_1 can be referred to herein as indicator LVST_1.

The various interconnects disclosed herein are used to communicate information between various modules either directly or indirectly. For example, an interconnect can be implemented as a passive device, such as one or more conductive traces (nodes), that transmit information directly between various modules, or as an active device, whereby information being transmitted is buffered, e.g., stored and retrieved, in the process of being communicated between devices, such as at a first-in first-out memory or other memory device. In addition, a label associated with an interconnect can be used herein to refer to a signal and information transmitted by the interconnect. For example, the voltage provided via voltage reference node V_SUPPLY can be referred to herein as voltage V_SUPPLY.

During operation, the voltage regulator/supply 11 provides V_SUPPLY to power various portions of the device 10, as represented by other circuitry 15, which includes a set of components designed to operate properly within extreme voltages Vmin and Vmax that define an operational voltage range Vmin to Vmax. The reference voltages V_LVD and V_HVD are set to voltages at, or within, the range Vmin-Vmax to set upper and lower operational voltage boundaries (extreme voltages), respectively, of the device 10.

The low-voltage detect module 13 monitors V_SUPPLY to determine whether V_SUPPLY drops below V_LVD, and can set an indicator or notifies a control portion of device 10 (not shown) in response to V_SUPPLY dropping below V_LVD, which sets the lower boundary of the operational voltage range of device 10. Similarly, the high-voltage detect module 14 monitors V_SUPPLY and determines whether V_SUPPLY rises above V_HVD, and can set an indicator or provide an indicator (not shown) to a control portion of device 10 in response to V_SUPPLY rising above V_HVD, which sets the upper boundary of the operation voltage range.

Device 10 includes a self test feature to verify that the low-voltage detect module 13 and that the high-voltage detect module 14 meet a particular operating criteria, and are therefore operational. According to a specific embodiment, a user can request a single self test cycle of the low-voltage detect circuitry to be performed by writing to memory 12 to assert indicator LVST_1, or can request multiple self test cycles be performed by asserting indicator LVST_C. Similarly, a user can request a single self test cycle of the high voltage detect circuitry to be performed by writing to memory 12 to assert indicator HVST_1, or can request multiple self test cycles be performed by asserting indicator HVST_C. In response to indicator LVST_1 being asserted, a self test of the low-voltage detect module 13 is performed. If the self test is successful, the indicator LVST_STATUS is asserted, otherwise, the indicator LVST_STATUS is negated. Similarly, in response to the indicator HVST_1 being asserted, a self test of the high-voltage detect module 14 is performed. If the self test is successful, the indicator HVST_STATUS is asserted, otherwise, the indicator HVST_STATUS is negated. For convenience, the low-voltage detect module 13 is primarily described herein, as it will be appreciated that the high-voltage detect module 14 operates in a similar manner as the low-voltage detect module 13.

As indicated above, self test circuitry of the low-voltage detect module 13 enters a self test mode of operation in response to either indicator LVST_1 or indicator LVST_C being asserted. According to one embodiment of the present disclosure, a successful self test of the low-voltage detect module 13 will result in the low-voltage detect module 13 returning to normal operation asynchronously. For example, in response to the assertion of indicator LVST_1 being asserted during normal mode of operation, low-voltage detect module 13 enters a self test mode of operation during which a comparator of the low-voltage detect module 13 is tested. Upon successfully verifying operation of the comparator, the device 10 asynchronously returns to the normal mode of operation without waiting for a next clock cycle of device 10 or for servicing by user's instruction. Therefore, the self test time during which the comparator is not performing its intended function depends primarily on the response time of the comparator and not of a system clock or upon servicing by a user. FIGS. 2-6 illustrate various embodiment of device 10.

Figure 2:
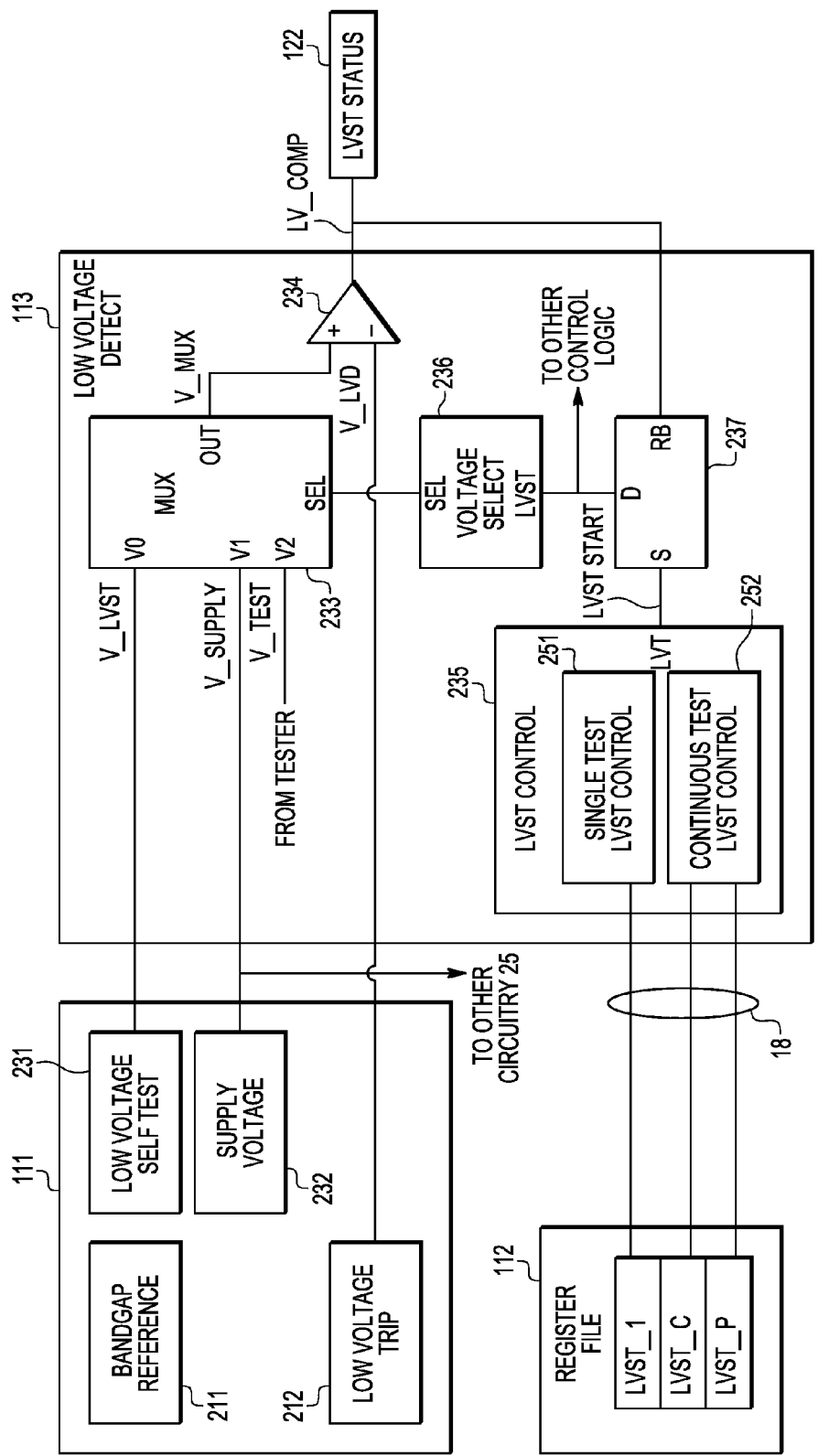
FIG. 2 illustrates a specific embodiment of a portion of FIG. 1 in accordance with a particular embodiment of the present disclosure.

FIG. 2 illustrates a particular embodiment of a portion of device 10, including a voltage control module 111 corresponding to voltage control module 11 of FIG. 1, a low-voltage detect module 113 corresponding to low-voltage detect module 13 of FIG. 2, and a register file 112 corresponding to memory module 12 of FIG. 1.

Voltage control module 111 includes a bandgap reference module 211, a supply voltage module 232, a low-voltage self test module 231, and a low-voltage trip module 212. The supply voltage module 232 generates the voltage V_SUP-PLY, which is used to power various portions of device 15 including other circuitry 15. The low-voltage trip module 212 generates voltage V_LVD that sets the lower boundary of the operating voltage range of the other circuitry 15. The low-voltage self test module 231 generates voltage V_LVST that is used to test a portion of the low-voltage detect module 113 during a self test cycle. The low voltage self test module 231, supply voltage module 232, and the low voltage trip module 212 can provide their respective voltages based upon the bandgap reference 211, based upon external voltage references, the like and combinations thereof.

The voltage V_LVST is less than the voltage V_LVD, and is therefore outside of the operating voltage range of the other circuitry 15 defined by V_LVD and V_HVD. According to one embodiment, the voltage V_LVST is chosen to be as close to V_LVD as possible in order to verify that a small voltage less than L_LVD, e.g., less than the lower extreme voltage of the operational voltage range voltage, will be detected by the low-voltage detect module 113, but far enough from V_LVD to conclude that the low-voltage detect module 113 is not operational in the event that the comparator does not detect V_LVST as being at a lower voltage than V_LVD.

Low-voltage detect module 113 includes a mselection circuit 233, a comparator 234, a voltage select module 236, a Set/Reset (SR) latch 237, and a low-voltage self test (LVST) control module 235. MUX 233 includes an input V0 connected to the low voltage self test module 231 to receive the voltage V_LVST, an input V1 connected to supply voltage module 232 to receive the voltage V_SUPPLY, an input V2 that receives a voltage labeled V_TEST that can be provided from a device external to 10, such as a tester, an input SEL to receive a signal that indicates which one of the inputs V0-V2 are to be selected, and an output OUT to which the voltage at the selected input is provided. It will be appreciated that the selection circuit 233 is implemented as a multiplexor, also referred to as MUX 233, and can include additional inputs, or fewer inputs, in the event V_TEST is not implemented, for example.

Comparator 234 includes a positive input terminal connected to the output OUT of MUX 233, a negative input terminal connected to receive voltage V_LVD from the low voltage trip module 212, which is also referred to as trip voltage V_LVD, and an output to provide a signal, labeled LV_COMP, that is asserted when the voltage (V_MUX) at the output of the multiplexer 233 is greater than V_LVD, and that is negated when the voltage at the output of the multiplexer 233 is less than V_LVD.

The low-voltage self test (LVST) control module 235 includes a single test LVST control module 251 and a continuous LVST control module 252. The single test LVST control module 251 is connected to the register file 112 via interconnect 18 to receive the indicator LVST_1 from register file 112. The continuous test LVST control module 252 is connected to the register file 112 via interconnect 18 to receive the indicators LVST_C and LVST_P. LVST control module 235 includes an output LVT to provide an asserted signal when a self test cycle is to be executed.

SR latch 237 has as set input S connected to output LVT of LVST control module 235, an input RB connected to the output of the comparator 234, and an output D. An asserted signal (logic high) at input S causes an asserted (logic high) signal to be provided at output D. An asserted signal (logic low) at input RB causes a negated (logic low) signal to be provided at output D.

Voltage select module 236 has an input LVST connected to the output D of SR latch 237, and an output SEL connected to the input SEL of MUX 233. Based upon the state of the signal received at input LVST and the state of other signals (not illustrated) the voltage select module 236 will determine which one of the inputs of MUX 233 is to be selected, and provides an appropriate signal at its output SEL identifying that input.

It will be appreciated that the low-voltage detect module 113 may include other components to facilitate its operation. For example, one or more delay elements can be used to ensure proper timing. Such delay elements can be skewed delay elements that introduce an asymmetric amount of delay on rising and falling edges to introduce hysteresis. For example, a skewed delay block can be used at the output of the comparator 234.

During operation of device 10, the low-voltage detect module 113 can operate in a normal mode that monitors the voltage V_SUPPLY, a test mode that provides the voltage V_TEST to the comparator 234, or in a self test mode that provides the voltage V_LVST to the comparator 234 to determine if the comparator 234 is operating properly. During the normal mode of operation, the voltage select module 236 provides a signal to the SEL input of multiplexor 233 that identifies the input V1 for selection by the MUX 233. For example, the signal V_SUPPLY received at input V1 is provided at output OUT, and therefore V_MUX is equal to V_SUPPLY. Thus, in normal mode of operation, V_SUPPLY, which powers the other circuitry 15, is provided to the positive input of comparator 234, while the trip voltage V_LVD is provided to the negative input of the comparator 234. So long as voltage V_SUPPLY is greater than voltage V_LVD during normal operation, the signal LV_COMP will be asserted to indicate V_SUPPLY is above the lower boundary of an operational voltage. However, should the voltage V_SUPPLY drop below-voltage V_LVD, the signal LV_COMP will be negated to indicate V_SUPPLY is below a desired operational voltage range and logic of device 10 (not shown) will respond in a predefined manner to account for the low-voltage condition. For example, device 10 can set a register indicator that can be polled by user's instructions, or can trigger an exception.

Operation of device 10 as illustrated at FIG. 2 is described in greater detail with reference to the timing diagram of FIG. 3, which represents operation of device 10 when the comparator 234 is operating properly. Prior to time T1 of FIG. 3, the device 10 is operating in a normal mode of operation, wherein the voltage select module 236 of FIG. 2 is providing a select signal (01) that selects input V1 of MUX 233, which causes V_SUPPLY to be provided to the output of the MUX 233.

Responsive to either one of register LVST_1 or LVST_C being asserted, the LVST control module 235 will assert signal LVT. For example, prior to T1 a write operation at device 10 has occurred that results in the indicator LVST_1 being latched at an asserted value at the rising edge of signal CLK at time T1. Note that while the initiation of a self test cycle has been described as occurring in response to a register being written to in a synchronous manner, it will be appreciated that in other embodiments the self test cycle can be initiated by an asynchronous indicator. Assertion of indicator LVST_1 at time T1 enables the single test LVST control module 251 to assert output LVT at time 310. In a particular embodiment, single test LVST control module 251 provides exactly one pulse to its LVT output in response to indicator LVST_1 being asserted. Alternatively, if indicator LVST_C had been asserted at register file 112, the continuous test LVST control module 252 would generate a plurality of pulses at output LVT, including the pulse at time 311, thereby initiating a plurality of self test cycles. According to one embodiment, the continuous test LVST control module 252 will continue to provide pulses to the output LVT at a time interval that can be fixed or programmable so long as indicator LVST_C remains asserted. A programmable time interval can be programmed to register LVST_P according to an embodiment where the time interval is programmable. Maintaining the same time interval between each self test results in a periodic self test interval. According to the embodiment illustrated at FIG. 3, the indicator LVST_1 at register file 112 will remain asserted until negated by a subsequent write by the user as described below, even though the low voltage detect module has returned to normal operating mode.

Figure 3:
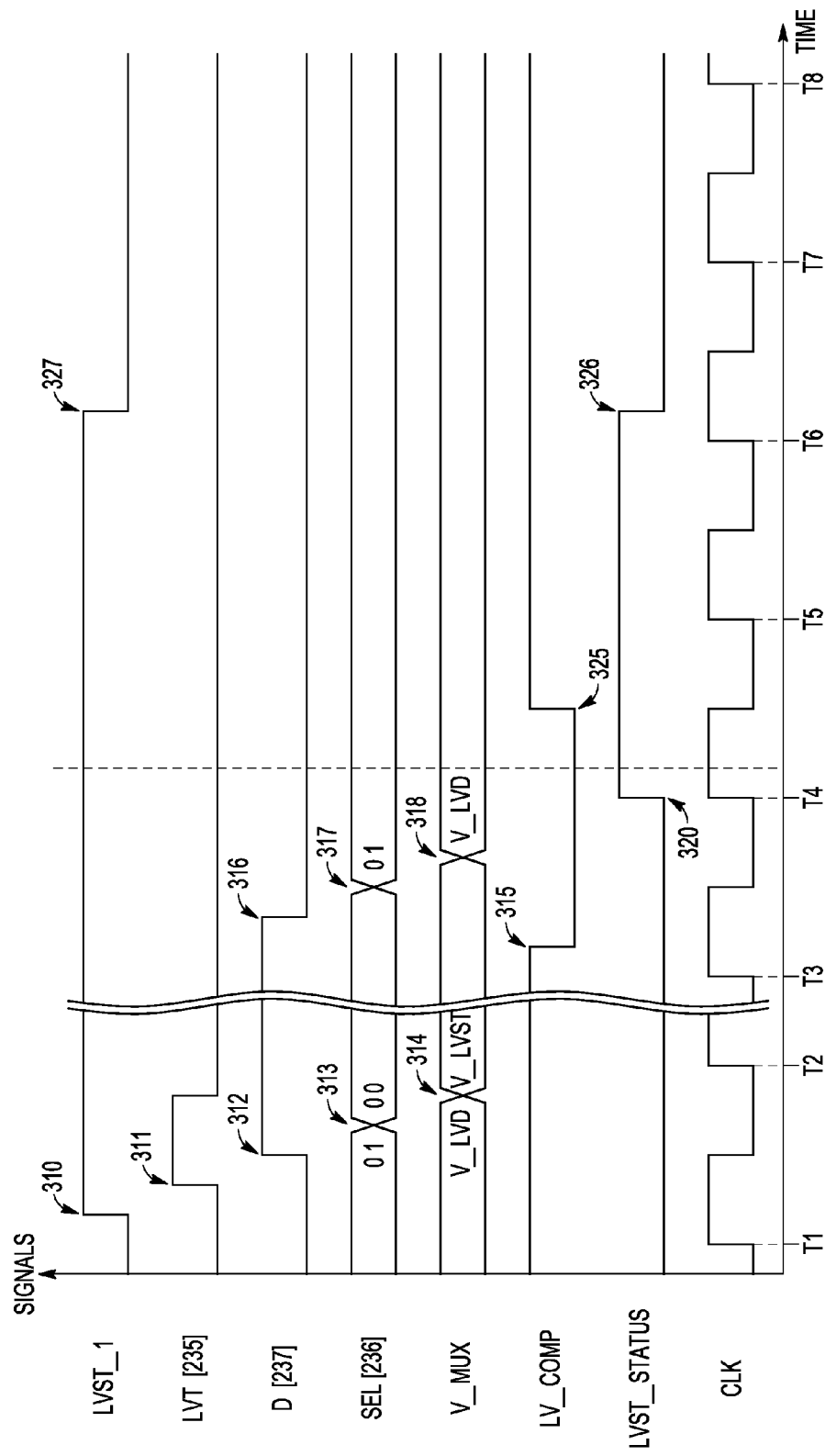
FIG. 3 illustrates a timing diagram in accordance with a particular embodiment of the present disclosure.
Figure 4:
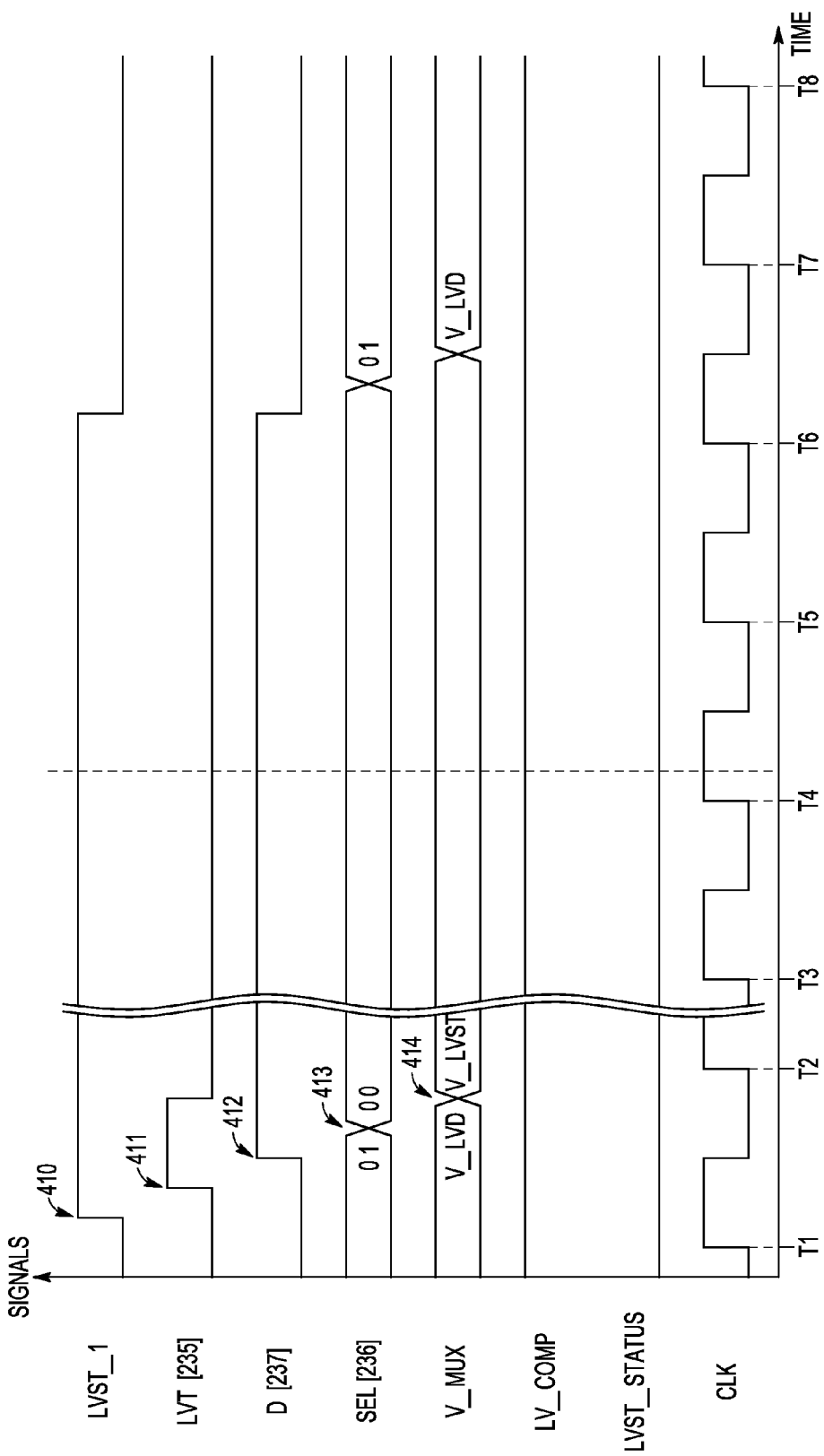
FIG. 4 illustrates a timing diagram in accordance with a particular embodiment of the present disclosure.
Figure 5:
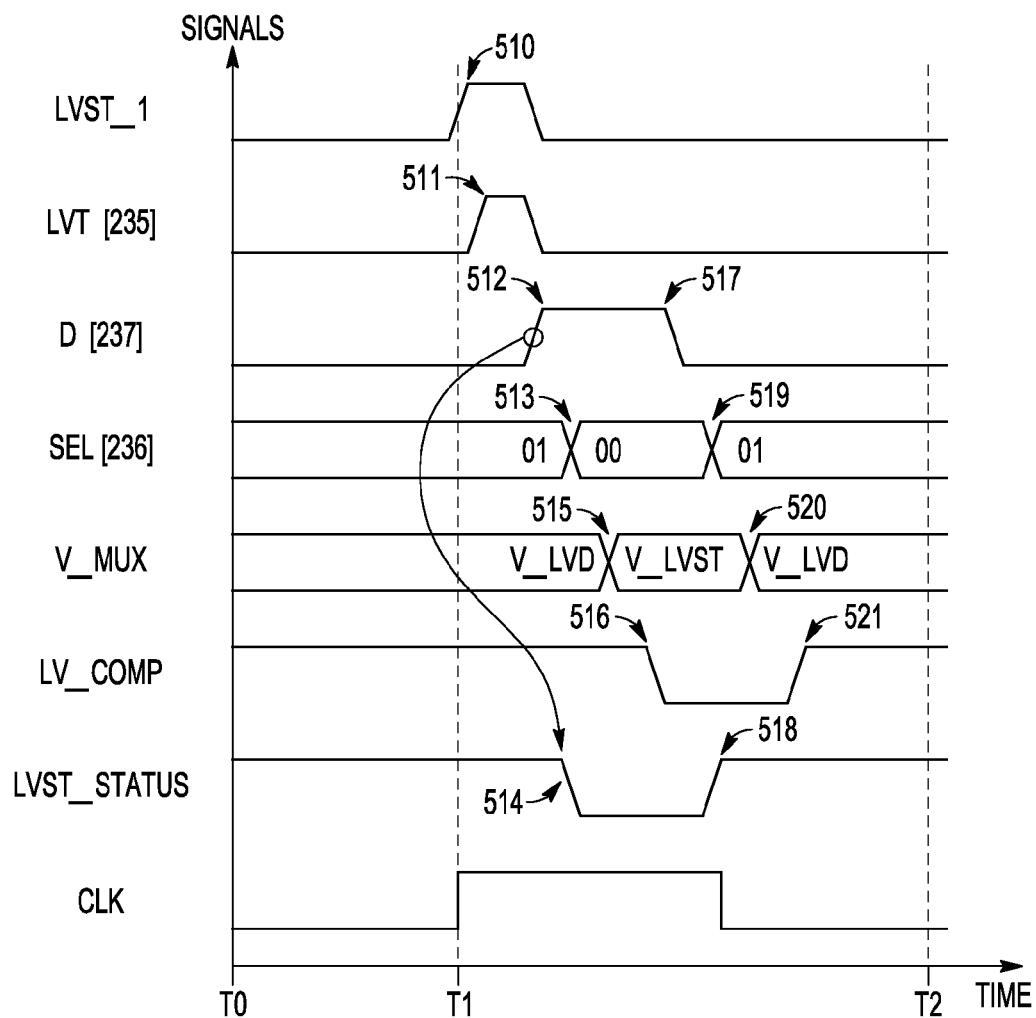
FIG. 5 illustrates a timing diagram in accordance with a particular embodiment of the present disclosure.
Figure 6:
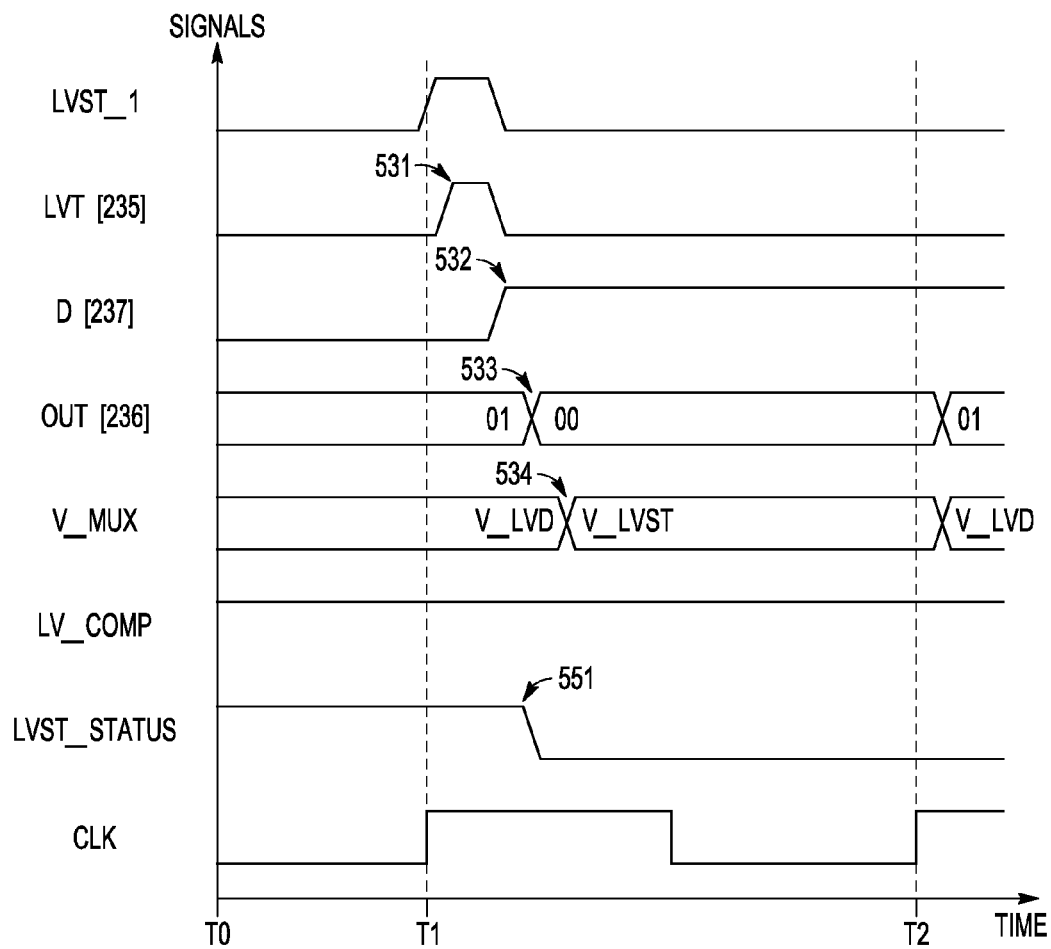
FIG. 6 illustrates a timing diagram in accordance with a particular embodiment of the present disclosure.

Note that for clarity the reference numbers of the elements associated with the inputs and outputs illustrated at FIG. 2 are appended to the names of the inputs and outputs in FIG. 4 through FIG. 6 For example, the label LVT[235] of FIG. 3 represents the signal at the output LVT of the LVST control module 235, while the label D[237] represents the signal at the output D of the SR latch 237.

The pulse provided at output LVT is received at input S of SR latch 237, and results in an asserted signal being provided at the output D of the SR latch 237 at time 311. The asserted signal at output D of latch 237 is received at to the LVST input of voltage select module 236, which results in the voltage select module 236 providing a self test indicator, e.g., a binary select signal (00b) at time 313, at its output (SEL) that is used to select input V0 of MUX 233 during self test operation. As a result of input V0 being selected, MUX 233 provides the voltage at input V0 (V_LVST) to its output OUT (V_MUX in FIG. 3) at time 314.

Because the comparator 234 is operating properly, with respect to the timing diagram of FIG. 3, during normal operation of the comparator 234 the signal LV_COMP is driven to an asserted value (logic high) by the comparator 234 during normal operation to indicate V_SUPPLY is within a valid operating range. However, during self test mode of operation, the comparator 234 determines whether the voltage of signal V_LVST is less than the trip voltage V_LVD. Note that in the embodiment illustrated at FIG. 3, the response time needed by the comparator 234 to detect when V_LVST voltage is less than V_LVD is presumed to be greater than one clock cycle.

Thus, referring to FIG. 3, after asserting the LVT output of the LVST control module 235, e.g., after starting a self test cycle, the signal LV_COMP is negated at time 315 when it is determined that the voltage V_LVST is less than the trip voltage V_LVD. In one embodiment, the voltage V_LVST is set to no greater than 300 millivolts (mV) below voltage V_LVD. In other embodiments, the voltage V_LVST is set to be no greater than 250 mV, 200 mv, or 150 mV less than voltage V_LVD. In accordance with a particular embodiment, the value of V_LVST can be fixed or user programmable. In one embodiment, in an attempt to avoid introducing a common failure mechanism into the generation of both V_LVST and V_LVD, there is no overlap of circuitry that is used to generate V_LVST with the circuitry that is used to generate V_LVD. Thus no common circuitry is used to generate V_LVST and V_LVD from the bandgap reference. In another embodiment, in an attempt to avoid introducing a common failure mechanism into the generation of both V_LVST and V_LVD, there is no overlap of circuitry that is used to generate V_LVST from the bandgap reference 211 with the circuitry that is used to generate V_LVD from the bandgap reference 211. Alternatively, the voltage V_LVST can be derived from the voltage V_LVD, resulting in all of the circuitry used to provide V_LVD being used to generate V_LVST.

The LVST_STATUS indicator is asserted in response to the next rising clock edge at time T4 after signal LV_COMP is negated. According to one embodiment, the LVST_STATUS indicator remains asserted until negated by a user write cycle, e.g., at time 326 as indicated at FIG. 3. In addition to being used to assert the LVST_STATUS signal, LV_COMP being negated results in signals propagating along a delay path in a manner that results in the low-voltage detect module 113 returning to its normal mode of operation at time 318, by virtue of selecting input V1 of MUX 233, without intervention of user software. In addition, the delay path, illustrated at FIG. 2, from the output of the comparator 234 to the select input of MUX 233 is asynchronous in that none of the path's elements are synchronized to a system clock signal, such as to a system clock signal that is synchronized to an instruction-based data processor (not shown) that executes user instructions, e.g., software. In one embodiment, such a data processor is part of the other circuitry 15. According to one embodiment, the amount of time from when the multiplexor selects input V0 at time 314 until when the comparator returns to selecting input V1 at time 318 is less than 300 ns. In a particular embodiment, the duration between time 314 and time is less than 200 ns for a low voltage detect module, and less than 270 ns for a high voltage detect module. The difference being due to comparator delay skew.

The asynchronous delay path of FIG. 2 includes the SR latch 237, the voltage select module 236, and the MUX 233. Thus, the output D of SR latch 237 is negated at time 316 in response to receiving the negated signal LV_COMP at input RB. The negated signal at output D of SR latch 237 is provided to the input LVST of voltage select module 236, which in turn changes the binary select signal at time 317 at its output SEL from a value (00) that results in input V0 of MUX 233 being selected to a value (01) that identifies input V1 for selection. At time 318, the MUX 233 provides the selected voltage V_LVD to its output OUT, and the first input of the comparator 234 connects to supply voltage, V_SUPPLY, returning the low-voltage detect module 113 to a normal operating mode that monitors voltage V_SUPPLY for a low-voltage condition. This subsequently asserts signal LV_COMP at time 325

Thus, in the illustrated embodiment, a successful self test cycle is initiated by providing an asserted signal to input S of SR latch 237, and proceeds in an asynchronous manner relative the clock CLK, wherein the voltage select module 236 alternately selects input V0 followed by selection of input V1 in a manner wherein the delay between their selection is based upon a delay path that is not clock dependent or dependent upon servicing by a user. By asynchronously terminating the self test operation in response to a successful self test, e.g., in response to the signal LV_COMP transitioning from high to low, the amount of time that device 10 is in self test mode, and thus not monitoring the voltage V_SUPPLY, is reduced, allowing for V_SUPPLY to be monitored a greater amount of time. In the embodiment illustrated at FIG. 3, the self test cycle time from when the MUX 233 selects input V0 until it returns to selecting input V1 is greater than one clock cycle due to the response time of the comparator 234. In other embodiments, such as that described with reference to FIG. 5 below, the self test cycle time can be less than one clock cycle.

Operation of a specific embodiment of device 10 (FIG. 2) during a failed self test cycle is described relative to the timing diagram of FIG. 4. Responsive to either of register LVST_1 or register LVST_C being asserted, the LVST control module 235 will assert output LVT at time 411 as previously described. In a particular embodiment, the signal LVT is pulsed, and therefore returns to its negated state a short time later. According to the embodiment illustrated at FIG. 4, the indicator LVST_1 at register file 112 will remain asserted until negated by a subsequent write by the user as described below. In addition, it is presumed that the LVST_STATUS indicator has been written by the user to a negated state, and that the self test cycle will assert the indicator LVST_STATUS in response to a successful self test cycle.

The pulse provided at output LVT of the LVST control module 235 is received at input S of SR latch 237, and results in an asserted signal being provided at the output D of the SR latch 237 at time 412. The asserted signal at output D of latch 237 is received at the LVST input of voltage select module 236, which results in the voltage select module 236 providing a self test indicator, e.g., a binary select signal (00b) at time 413, at its select output (SEL) that is used to select input V0 of MUX 233 during self test operation. As a result of input V0 being selected, MUX 233 provides the voltage at input V0 (V_LVST) to its output OUT (V_MUX in FIG. 3) at time 414.

Prior to time 313, the signal LV_COMP was driven to an asserted value (logic high) by the comparator 234 to indicate V_SUPPLY is within a valid operating range. However, during self test mode of operation, the comparator 234 does not operate properly in that it does not detect that the voltage V_LVST is lower than the trip voltage V_LVD, and therefore the voltage at its output (LV_COMP) remains high resulting in the indicator LVST_STATUS remaining negated and input V0 of MUX 23 being selected.

According to one embodiment, failure of the comparator 234 is detected by the user poling the LVST_STATUS register after a predetermined amount of time that is sufficiently long for generation of an otherwise asserted LVST_STATUS indicator, which would indicate a successful self test. For example, a read of the LVST_STATUS register at time T5 can be used to determine that the self test failed. In response to a failure, the user can implement various precautionary procedures. According to the embodiment illustrated at FIG. 4, the user has negated the indicator at LVST_1, wherein the LVST control module 235 detects that LVST_1 has been negated and resets the S/R latch (by circuitry not shown) to return the low voltage detect module 113 to a normal mode of operation after detection of the failure. In an alternate embodiment, the device 10 can automatically cause an exception or reset to be generated in response to a failure.

FIG. 5 illustrates a timing diagram for an alternate operating embodiment of device 10 (FIG. 2) that assumes proper operation of the comparator 234. In particular, the timing diagram for FIG. 5 anticipates a comparator having a response time that is less than one clock cycle, such as can occur during a low voltage operation. As illustrated at FIG. 5, during normal operation of the comparator, e.g., prior to time 516, the signal LV_COMP was driven to an asserted value (logic high) by the comparator 234 to indicate V_SUPPLY is within a valid operating range. After receiving the asserted LVT signal at time 511, the signal at output D is asserted. In addition to being provided to the input LVST, the signal at output D is provided to other control logic (not illustrated) that results in the LVST_STATUS register being negated at time 314.

As described previously, the asserted signal at output D results in the signal LV_COMP being negated at 316, which during self test indicates proper operation of the comparator 234. The negated signal LV_COMP propagates along the asynchronous delay path described above to return the low voltage detect module 113 to normal operation by selection of input V1 of MUX 233. In addition, the negation of LV_COMP results in indicator LVST_STATUS being asserted at time 318. In this manner the user can poll register LVST_STATUS determine if self test was successful.

Alternate operation of device 10 (FIG. 2) during a failed self test cycle is described relative to the timing diagram of FIG. 6. Responsive to either of register LVST_1 or register LVST_C being asserted, the signal LVT will be asserted at time 531 as previously described. Assertion of LVT at time 531 results in the output D of the SR latch 237 being asserted at time 532. The asserted signal at output D is provided to the LVST of voltage select module 236 and to the other control logic to negate the value of LVST_STATUS. Assertion of input LVST at time 532 results in the voltage select module 236 providing a binary select signal (00b) at time 533 that will be used by MUX 233 to select input V0 during self test operation. Thus, mux 233 provides the voltage L LVST to output OUT at time 534, and the voltage V_MUX is the same as voltage V_LVST. Assuming the comparator 234 is not operating properly, as illustrated at FIG. 6, the comparator 234 will not detect that the voltage V_LVST is less than the trip voltage V_LVD, even though it actually can be, which results in signal LV_COMP remaining asserted.

Because signal LV_COMP remains asserted, the self test cycle is not terminated prior to the next rising clock edge at time T2. Thus, at time T2 the LVST_STATUS register remains negated to indicate the self test cycle failed. The lack of a transitioning state of signal LV_COMP can be detected in a subsequent clock cycle by reading the state of LVST_STATUS register by a user instruction or a by otherwise detecting the failed state after a predetermined amount of time. The failure of self test is detected synchronously. In one embodiment, failure of a self test cycle results in an exception event being generated that is a manner prescribed by a user. In another embodiment, failure of the self test cycle results in a reset operation of the device 10. In another embodiment, failure of a self test cycle does not generate an exception, but instead results in the SR latch 237 being reset, and maintains the register LV_STATUS in its negated state until reset by the user.

In a first aspect, a method can include comparing with a comparator a first voltage used to power a set of devices at an integrated circuit to a first reference voltage, and determining, based upon the comparison, that the first voltage meets an operating criteria. The method can also include entering a self-test mode of operation from a first mode of operation responsive to receiving a first self-test indicator, responsive to entering the self-test mode of operation, testing the comparator to verify that the comparator is operational to detect a violation of the operating criteria when the test generates a test state at the output of the comparator, and in response to determining the comparator is operational, returning to the first mode of operation asynchronously.

In one embodiment of the first aspect, the method includes providing the first voltage to a first input of a multiplexor, providing a second reference voltage to a second input of the multiplexor, and wherein testing includes selecting the second input of the multiplexor to provide the second reference voltage to the comparator instead of the first voltage. In a particular embodiment, the second reference voltage is within 300 millivolts of the first reference voltage, wherein the first reference voltage is between the first voltage and the second reference voltage. In a further embodiment, the method includes providing the self-test indicator in response to determining an indicator at a programmable storage location that enables self test has been asserted.

In another embodiment of the first aspect, the method includes providing the self-test indicator in response to determining an indicator at a programmable storage location that enables self test has been asserted, wherein only one the first self-test indicator is asserted in response to the indicator at the programmable storage location being asserted. In an further embodiment, the method includes providing the self-test indicator in response to determining an indicator at a programmable storage location that enables self test has been asserted, wherein a plurality of self-test indicators, including the first self-test indicator, are providing on a periodic interval in response to the indicator at the programmable storage location being asserted. In an even further embodiment, a duration of the periodic interval is based upon a value stored at a second programmable storage location.

In a further embodiment of the first aspect, the method includes returning to the first mode of operation occurs within 300 ns of entering the self-test mode of operation. In a particular embodiment, generating the first voltage reference and the second voltage reference based on a bandgap reference. In another embodiment, no common circuitry is used to generate the first voltage reference and the second voltage reference based on the band gap reference. In still another embodiment, the first voltage reference and the second voltage reference are generated by substantially the same circuitry. In still another embodiment, providing an asserted self-test result indicator in response to determining the comparator is operational, otherwise, providing a negated self-test result indicator in response to determining the comparator is not operational.

In a second aspect, the device can include a comparator including a first comparator input, a second comparator input, and a comparator output. The device can also include a selection circuit including a first data input, a second data input, a select input and an output coupled to the first input of the comparator, the first input to receive a first voltage identifying a first extreme voltage of an operational voltage range, the second input coupled to receive a second voltage, the first extreme voltage between the first voltage and a second extreme voltage of the operational voltage range, and a delay path between the output of the comparator and the select input of the multiplexor that asynchronously selects select the first data input of the multiplexor responsive to the second input being previously selected.

In one embodiment of the second aspect, the asynchronous delay path includes control logic having a first input to receive a self-test indicator, a second input to receive a signal communicated from the output of the comparator, and an output to provide a first select signal to switch from selecting the first input to selecting the second data input of the multiplexer in response to receiving an asserted self-test indicator at the first input, and to asynchronously provide a second select signal to switch from selecting the second data input to selecting the first data input of the multiplexer in response to the comparator providing a signal that indicates the first voltage reference is outside the operational voltage range. In another embodiment, the device includes a first programmable location to store a first indicator, and a control logic that includes the delay path having a first input coupled to the first programmable storage location, a second input coupled to the output of the comparator, and an output to provide a select signal to select the second data input of the multiplexor responsive to a state of the first indicator, and to subsequently provide the select signal to select the first input responsive to a change of state at the output of the comparator occurring responsive to providing the second reference voltage to the comparator.

In another embodiment of the second aspect, the delay path includes self-test control logic to verify proper operation of the comparator in response to the second input being selected. In a particular embodiment, the self-test control logic is to periodically verify proper operation of the comparator in response to a first programmable location storing a first indicator. In an even more particular embodiment, the self-test control logic is to verify proper operation of the comparator only one time in response to a first programmable location storing a first indicator.

In a third aspect, the method can include providing a first voltage to a set of devices that are to operate within a first voltage range defined by a first trip voltage and a second trip voltage, providing by a first select circuit the first voltage to a first input of a first comparator, providing the first trip voltage to a second input of the first comparator and providing a first state at an output of the first comparator while providing the first voltage and the first trip voltage to the first comparator, the first state at the second comparator indicative of the first voltage meeting the an operating criteria defined by the first trip voltage. The method can also include at a first time, switching from providing by the select circuit the first voltage to providing a first self-test voltage to the first input of the first comparator, the first self test being outside of the first voltage range, responsive to providing the first self-test voltage, determining whether the output of the first comparator is at a second state, and responsive to the output of the comparator being in the second state, and independent of any user software intervention, switching the select circuit from providing the first self-test voltage to providing the first voltage to the first input of the first comparator.

In one embodiment of the third aspect, the method includes providing by a second select circuit the first voltage to a first input of a second comparator, and providing the second trip voltage to a second input of the second comparator, The method also includes providing the first state at an output of the second comparator while providing the first voltage and the second trip voltage to the first comparator, the first state at the second comparator indicative of the first voltage meeting the an operating criteria defined by the first trip voltage, and at a second time, switching from providing by the second select circuit the first voltage to providing a second self-test voltage to the first input of the second comparator, the second self-test voltage being between outside first voltage range.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Accordingly, for example, it will be appreciated that the comparator 234 can be an analog comparator that functions in a manner to have a response time that is not dependent upon any system clock of the device 10. Alternatively, the comparator can function in a manner that its response time is dependent upon a system clock of the device 10. In such an embodiment, the low voltage detect module returns to normal operation asynchronous to any system clock in response to the MUX input V0 being selected except for the response time of the comparator. For example, the low voltage detect module will return to normal operation independent of any intervening clock transition, or servicing by user's instruction, once proper operation of the comparator is confirmed. In another embodiment of the present disclosure, the delay path between the output of the comparator 234 and the select input of the MUX 233 can include synchronous elements, so long as no user software intervention is used to facilitate return the low voltage detect module 113 to a normal mode of operation. For example, flip-flops can be used that are synchronized to a system clock that latches various signals as they transition from the output of the comparator 234 to the select input of MUX 233. It will also be appreciated that the figures are not intended to preclude other variations consistent with the disclosure. For example, the voltage control module 11 could be integrated at an integrated circuit, such as a common substrate, in a modular manner or could be distributed throughout the integrated circuit. In other embodiment, some or all of the voltage control circuitry could be implemented external from a substrate at which other portions of the device are formed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
   a comparator comprising a first comparator input, a second comparator input, and a comparator output;
   a selection circuit comprising a first data input, a second data input, a select input and an output coupled to the first input of the comparator, the first input to receive a first voltage identifying a first extreme voltage of an operational voltage range, the second input coupled to receive a second voltage, the first extreme voltage between the first voltage and a second extreme voltage of the operational voltage range; and
   a delay path between the output of the comparator and the select input of the selection circuit that asynchronously selects the first data input of the selection circuit responsive to the second input being previously selected.

2. The device of claim 1 wherein the asynchronous delay path comprises:
   control logic having a first input to receive a self-test indicator, a second input to receive a signal communicated from the output of the comparator, and an output to provide a first select signal to switch from selecting the first input to selecting the second data input of the selection circuit in response to receiving an asserted self-test indicator at the first input, and to asynchronously provide a second select signal to switch from selecting the second data input to selecting the first data input of the selection circuit in response to the comparator providing a signal that indicates the first voltage reference is outside the operational voltage range.

3. The device of claim 1 further comprising:
a first programmable location to store a first indicator; and
a control logic that comprises the delay path having a first input coupled to the first programmable storage location, a second input coupled to the output of the comparator, and an output to provide a select signal to select the second data input of the selection circuit responsive to a state of the first indicator, and to subsequently provide the select signal to select the first input responsive to a change of state at the output of the comparator occurring responsive to providing the second reference voltage to the comparator.

4. The device of claim 1, wherein the delay path includes self-test control logic to verify proper operation of the comparator in response to the second input being selected.

5. The device of claim 4, wherein the self-test control logic is to periodically verify proper operation of the comparator in response to a first programmable location storing a first indicator.

6. The device of claim 1, wherein the self-test control logic is to verify proper operation of the comparator only one time in response to a first programmable location storing a first indicator.

* * * * *